United States Patent
Seddon

(10) Patent No.: US 11,075,129 B2
(45) Date of Patent: Jul. 27, 2021

(54) SUBSTRATE PROCESSING CARRIER

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/656,140

(22) Filed: Oct. 17, 2019

(65) Prior Publication Data

US 2020/0051877 A1 Feb. 13, 2020

Related U.S. Application Data

(63) Continuation-in-part of application No. 15/907,931, filed on Feb. 28, 2018, now Pat. No. 10,461,000, which is a continuation-in-part of application No. 15/704,246, filed on Sep. 14, 2017, now Pat. No. 10,170,381, which is a continuation of application No. 15/230,875, filed on Aug. 8, 2016, now Pat. No. 9,793,186.

(60) Provisional application No. 62/827,982, filed on Apr. 2, 2019.

(51) Int. Cl.
| | |
|---|---|
| *H01L 23/58* | (2006.01) |
| *H01L 29/10* | (2006.01) |
| *H01L 21/66* | (2006.01) |
| *H01L 21/683* | (2006.01) |
| *G01R 31/28* | (2006.01) |
| *H01L 21/78* | (2006.01) |
| *H01L 21/304* | (2006.01) |

(52) U.S. Cl.
CPC .......... *H01L 22/34* (2013.01); *G01R 31/2831* (2013.01); *H01L 21/6836* (2013.01); *H01L 21/78* (2013.01); *H01L 22/12* (2013.01); *H01L 22/32* (2013.01); *G01R 31/2865* (2013.01); *H01L 21/304* (2013.01); *H01L 22/14* (2013.01); *H01L 2221/6834* (2013.01); *H01L 2221/68327* (2013.01); *H01L 2221/68381* (2013.01)

(58) Field of Classification Search
CPC combination set(s) only.
See application file for complete search history.

(56) References Cited

U.S. PATENT DOCUMENTS

| | | | |
|---|---|---|---|
| 9,793,186 B1 | 10/2017 | Seddon et al. | |
| 2002/0174951 A1* | 11/2002 | Hu ................... | H01L 21/31111 156/345.19 |
| 2010/0194423 A1 | 8/2010 | Tago | |
| 2013/0076384 A1 | 3/2013 | Chang | |
| 2013/0234745 A1* | 9/2013 | Yamada ................. | G01R 1/44 324/750.11 |
| 2013/0264686 A1* | 10/2013 | Shoichi ............... | H01L 21/6835 257/618 |
| 2014/0051189 A1 | 2/2014 | Kai-Jun | |
| 2014/0203829 A1* | 7/2014 | Yamada ............. | G01R 31/2863 324/750.08 |
| 2014/0252641 A1 | 9/2014 | Lim et al. | |

(Continued)

*Primary Examiner* — Niki H Nguyen
(74) *Attorney, Agent, or Firm* — Adam R. Stephenson, Ltd.

(57) ABSTRACT

Implementations of a substrate carrier may include: a top ring configured to enclose an edge of a first side of a substrate; and a bottom support configured to enclose an entire second side and an edge of the second side of the substrate.

20 Claims, 18 Drawing Sheets

(56) References Cited

U.S. PATENT DOCUMENTS

2014/0318575 A1* 10/2014 Parkhe .................... C04B 35/44
                                                          134/1.1
2015/0001709 A1   1/2015 Bao et al.
2015/0015288 A1   1/2015 Ma
2015/0115037 A1*  4/2015 Hoobler ................ G06F 1/1637
                                                        235/462.45

* cited by examiner

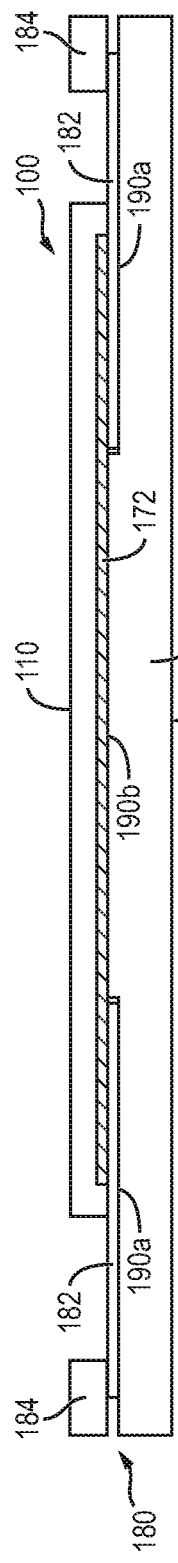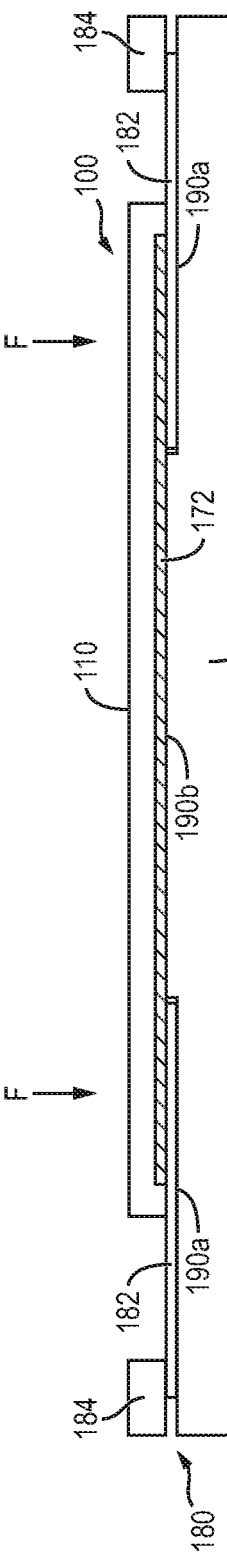

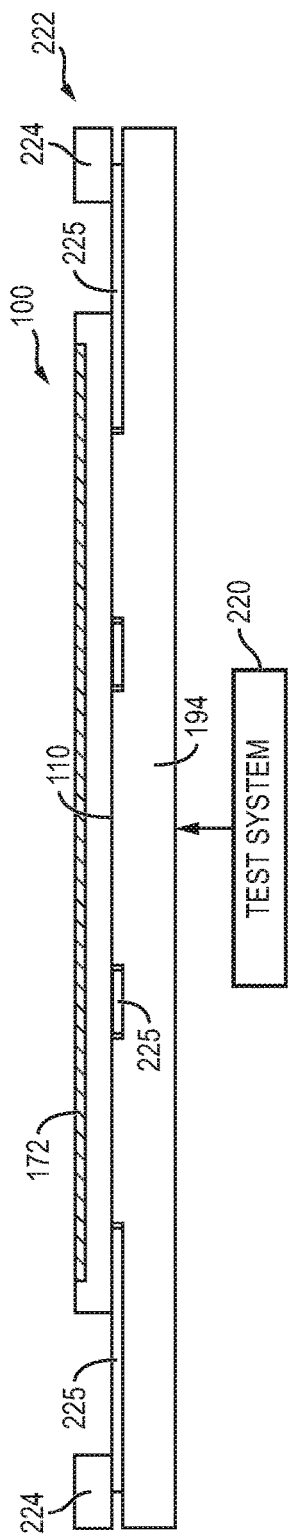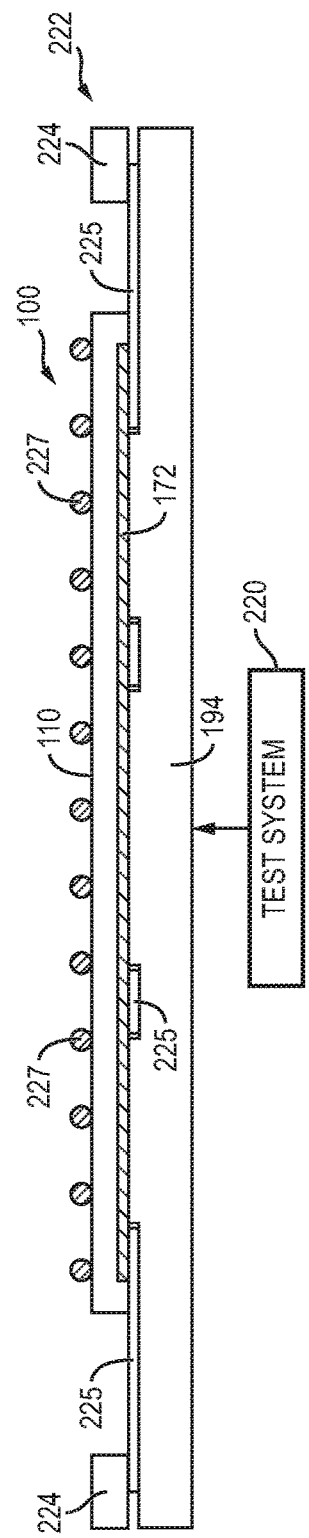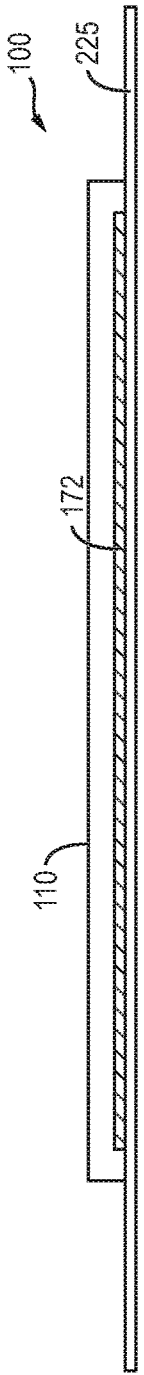

SUBSTRATE PROCESSING CARRIER

CROSS REFERENCE TO RELATED APPLICATIONS

This document claims the benefit of the filing date of U.S. Provisional Patent Application 62/827,982, entitled "Substrate Processing Carrier" to Michael J. Seddon which was filed on Apr. 2, 2019, the disclosure of which is hereby incorporated entirely herein by reference.

This application is a continuation-in-part application of the earlier U.S. Utility Patent Application to Michael Seddon entitled "Semiconductor Wafer and Method of Probe Testing," application Ser. No. 15/907,931, filed Feb. 28, 2018 now pending, which is a continuation-in-part of U.S. patent application Ser. No. 15/704,246, now U.S. Pat. No. 10,170,381, filed Sep. 14, 2017, and issued Jan. 1, 2019, which is a continuation of U.S. patent application Ser. No. 15/230,875, now U.S. Pat. No. 9,793,186, filed Aug. 8, 2016, and issued Oct. 17, 2017, the disclosures of each of which are hereby incorporated entirely herein by reference.

BACKGROUND

1. Technical Field

The present disclosure relates in general to semiconductor devices and, more particularly, to a semiconductor substrates and methods of probe testing.

2. Background

A semiconductor substrates includes a base substrate material. In various situations, semiconductor die formed on a substrate may be thinned to minimize the size of the semiconductor package. Testing and inspection of the semiconductor die is conducted for quality assurance and reliability.

SUMMARY

Implementations of a substrate carrier may include: a top ring configured to enclose an edge of a first side of a substrate; and a bottom support configured to enclose an entire second side and an edge of the second side of the substrate.

Implementations of a substrate carrier may include one, all, or any of the following:

The edge may be an edge ring of the substrate.

The first side of the substrate may be background.

The second side of the substrate may include a plurality of semiconductor die therein.

The thickness of the substrate may be less than 39 microns.

The thickness of the substrate may be less than 10 microns.

The top ring may configured to couple to the bottom support with a clamp, friction fit, snap, or hinge.

The substrate carrier may not be bonded to the substrate.

Implementations of a substrate carrier may include: a top ring configured to enclose an edge of a first side of a substrate; and a bottom support configured to enclose an entire second side and an edge of the second side of the substrate. The bottom support may further include a cavity therein configured to receive backgrinding tape applied to the second side of the substrate.

Implementations of a substrate carrier may include one, all, or any of the following:

The edge may be an edge ring of the substrate.

The first side of the substrate may be background.

The second side of the substrate may include a plurality of semiconductor die therein.

The thickness of the substrate may be less than 39 microns.

The thickness of the substrate may be less than 10 microns.

The top ring may be configured to couple to the bottom support with a clamp, friction fit, snap, or hinge.

The substrate carrier my not be bonded to the substrate.

Implementations of an apparatus for testing a semiconductor substrate may include: a substrate carrier including a top ring configured to enclose an edge of a first side of a substrate and a bottom support. The bottom support may be configured to allow a semiconductor substrate coupled with the substrate carrier to be electrically tested using a probe.

Implementations of an apparatus for testing a semiconductor substrate may include one, all, or any of the following:

The apparatus may further include one or more openings in the bottom support configured to allow the probe to directly contact the substrate during electrical testing.

The substrate carrier may be formed of a metal, a plastic coated in a metal, or a metal coated in a secondary metal.

The substrate carrier may be formed of an electrically conductive material or may include an electrically conductive material coupled thereto.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended substrate processing carrier will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such substrate processing carrier, and implementing components and methods, consistent with the intended operation and methods.

Semiconductor die/substrate testing typically involves contacting a surface of the semiconductor wafer with a test probe. Yet, for thinned semiconductor wafers/substrates, wafer test probing can lead to breakage or damage from probe pressure on the thin wafer surface, as well as wafer handling and wafer warpage. The thin semiconductor wafers are also subject to warpage due to film stresses. A warped thin semiconductor wafer is difficult to test because the test probes may not make contact with the warped surface.

In some cases, wafer test probing may be performed prior to wafer thinning because the large thin wafers, e.g., wafers with a diameter of 150-300 millimeters (mm), may be warped beyond the test probe contact tolerance, or because the thin wafer surface cannot handle the invasive nature of the test. Wafer testing prior to wafer thinning may be incomplete because certain features that are added post-wafer thinning, e.g., back-side metal, are not present for the test. In addition, for MOSFETS or wafers with through silicon vias, the current flows through the silicon and out the backside of the thinned wafer, i.e., through the back metal. Testing such devices is impractical for full-thickness wafers as the structures to be tested do not exist until after thinning. The thickness of the wafers may also affect the electrical performance. A thicker T-MOSFET wafer has more resistance than a thin wafer since the current passes through more silicon. Wafer testing and inspection before all features are present reduces quality assurance, and adds manufacturing cost because an untested defective die must be assembled just like an untested good die before functionality can be confirmed.

Figure 1A:
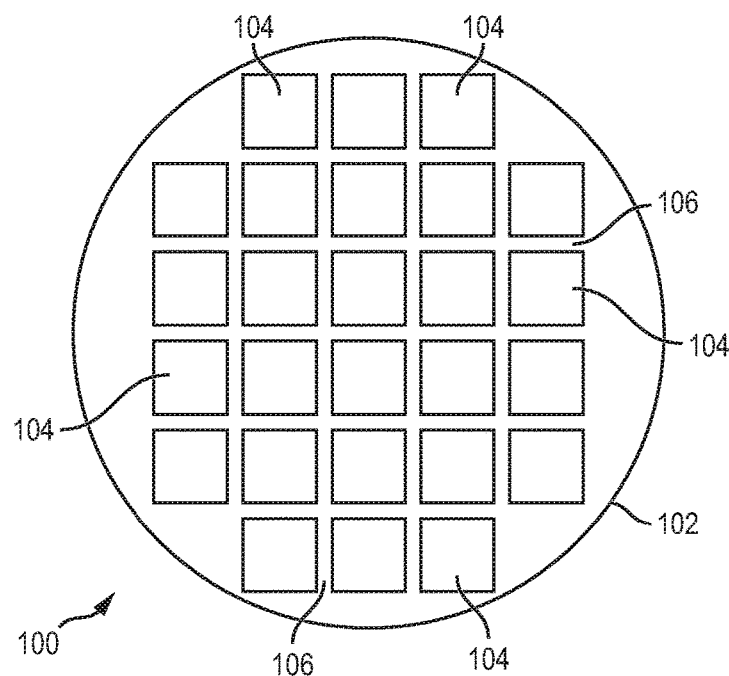
FIGS. 1a-1b illustrate a semiconductor wafer with a plurality of semiconductor die separated by a saw street.

FIG. 1a illustrates a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by saw street 106, as described above. Saw street 106 provides singulation areas to separate semiconductor wafer 100 into individual semiconductor die 104. In one implementation, semiconductor wafer 100 has a width or diameter of 100-450 mm and thickness of 675-775 micrometers ($\mu$m). In another implementation, semiconductor wafer 100 has a width or diameter of 150-300 mm.

Figure 1B:
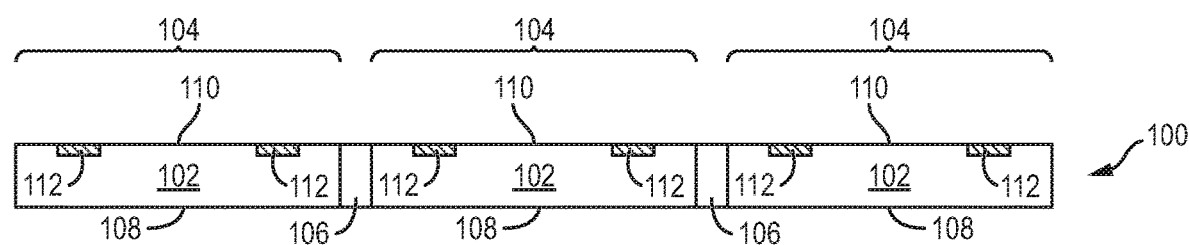

FIG. 1b shows a cross-sectional view of a portion of semiconductor wafer 100. Each semiconductor die 104 has a non-active back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as a digital signal processor (DSP), microcontroller, ASIC, power conversion, standard logic, amplifier, clock management, memory, interface circuit, and other signal processing circuit. Semiconductor die 104 may also contain an integrated passive device (IPD), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as interconnect pads electrically connected to the circuits on active surface 110.

In other implementations, semiconductor wafer 100 represents stacked semiconductor wafers, stacked semiconductor die on the wafer, silicon-on-insulator type wafers, stacked memory wafers, memory devices stacked on a ASIC wafer, stacked through silicon conductive vias (TSV) semiconductor wafers, or any other configuration of stacked wafers, stacked die on wafers, and stacked devices.

Figure 2A:
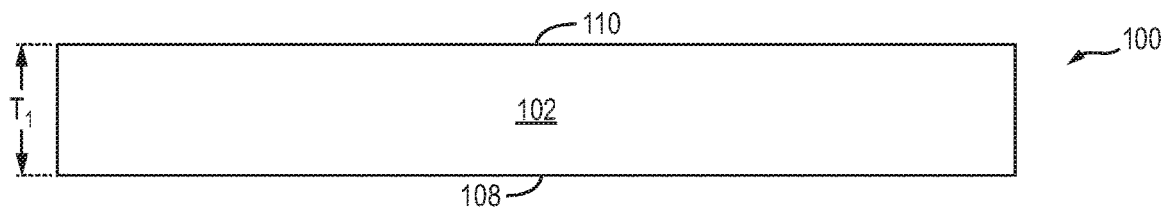
FIGS. 2a-2h illustrate a process of thinning a semiconductor wafer with an edge support ring.

FIGS. 2a-2h illustrate a process of thinning a semiconductor wafer with an edge support ring. FIG. 2a shows an entire area of semiconductor wafer 100 with back surface 108 and active surface 110. Semiconductor die 104 are present in active surface 110, see FIGS. 1a-1b, but not labeled for purposes of the present explanation. Semiconductor wafer 100 has a pre-grinding thickness T1 of 675-775 $\mu$m.

Figure 2B:
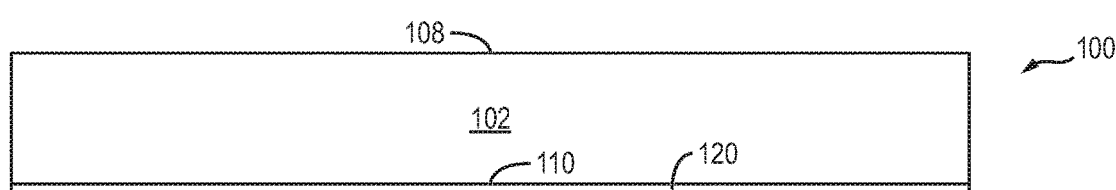
Figure 2C:
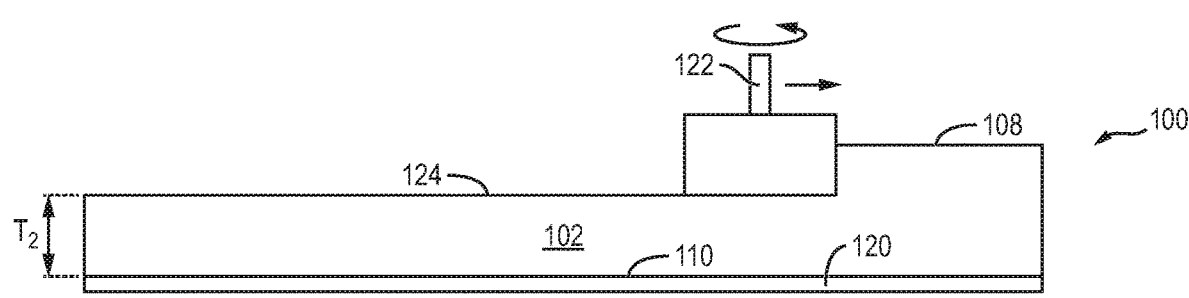

In FIG. 2b, semiconductor wafer 100 is inverted and mounted with active surface 110 oriented to backgrinding tape 120. In FIG. 2c, the entire back surface 108 undergoes a first backgrinding operation with grinder or grinding wheel 122 to remove a portion of base substrate material 102 down to surface 124. Semiconductor wafer 100 has a post-grinding thickness $T_2$ of 355 $\mu$m between active surface 110 and surface 124.

Figure 2D:
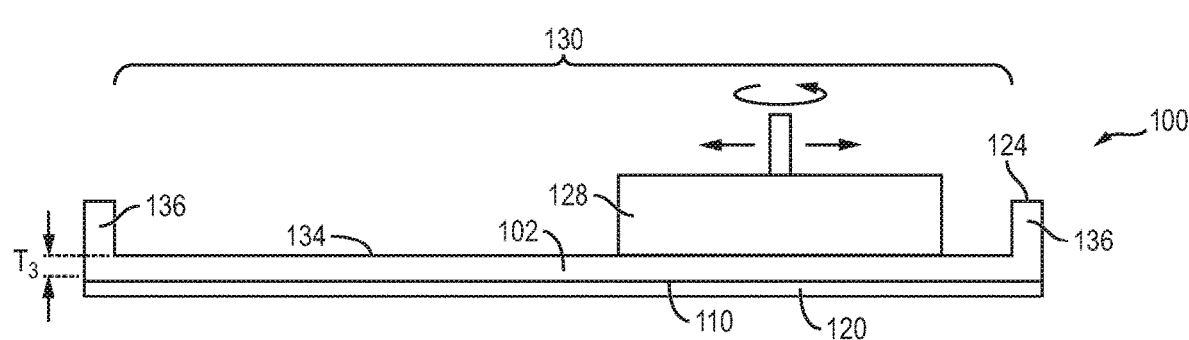

In FIG. 2d, a second grinding operation is applied to surface 124 using grinder or grinding wheel 128. Grinding wheel 128 moves in a cyclic, rotating pattern across an interior region or wafer grinding area 130 of semiconductor wafer 100 to remove a portion of base substrate material 102 down to surface 134. Grinding wheel 128 is controlled to leave edge support ring 136 of base substrate material 102 around a perimeter of semiconductor wafer 100 for structural support. In one implementation, the post-grinding thickness $T_3$ of semiconductor wafer 100 is 75 µm or less. In another implementation, the post-grinding thickness $T_3$ of semiconductor wafer 100 is 10-50 µm.

Figure 2E:
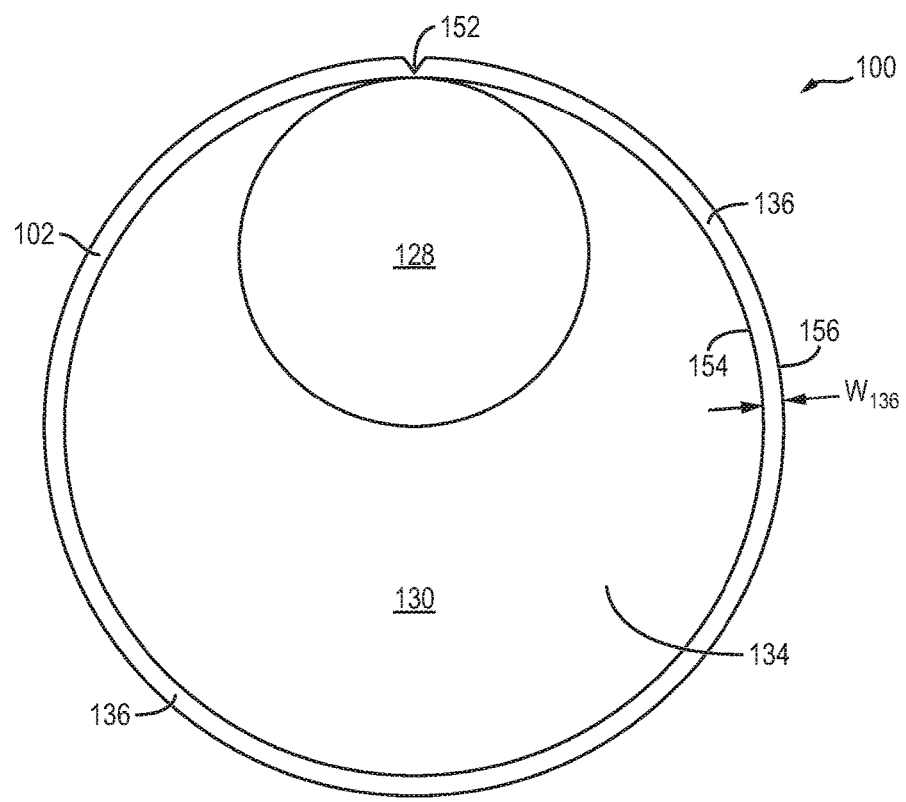

FIG. 2e shows a top view of grinding wheel 128 removing a portion of surface 134 of semiconductor wafer 100 to reduce the thickness of the semiconductor wafer, and correspondingly semiconductor die 104, in grinding area 130, while leaving edge support ring 136 of base substrate material 102 around a perimeter of the semiconductor wafer. Edge support ring 136 has a width $W_{136}$ of 3.0 mm±0.3 mm from inner wall 154 to outer edge 156 around semiconductor wafer 100. The height of edge support ring 136 is the first post-grinding thickness $T_2$, which is greater than the second post-grinding thickness $T_3$ of semiconductor wafer 100, to maintain structural integrity of the thinner semiconductor wafer.

Figure 2F:
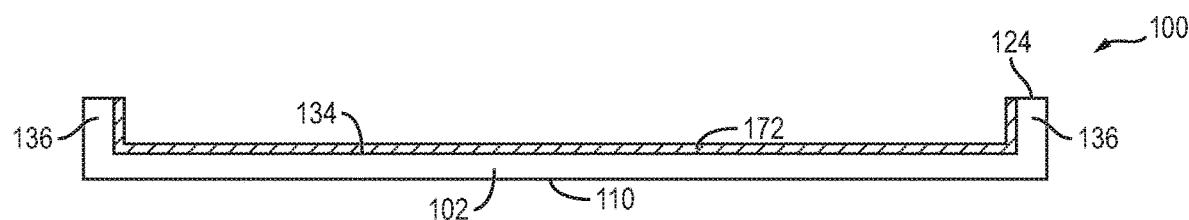

Referring to FIG. 2e and FIG. 2f, a post-grinding stress relief etch 152 is used to remove or reduce the damage in surface 134 of base substrate material 102 caused by the grinding process. Surface 134 of semiconductor wafer 100 is cleaned with a rinsing solution. An electrically conductive layer 172 is formed over surface 134 using PVD, CVD, electrolytic plating, electroless plating process, evaporation, or other suitable metal deposition process. Conductive layer 172 includes one or more layers of Al, Cu, Sn, Ni, Au, Ag, Ti, TiW, or other suitable electrically conductive material. Conductive layer 172 provides back-side electrical interconnect for semiconductor die 104. Conductive layer 172 makes connection to the circuits on active surface 110 through TSV. Conductive layer 172 is patterned into electrically common or electrically isolated portions according to the function of semiconductor die 104. Backgrinding tape 120 is removed by exposing the tape to ultraviolet (UV) light and peeling off.

Figure 2G:
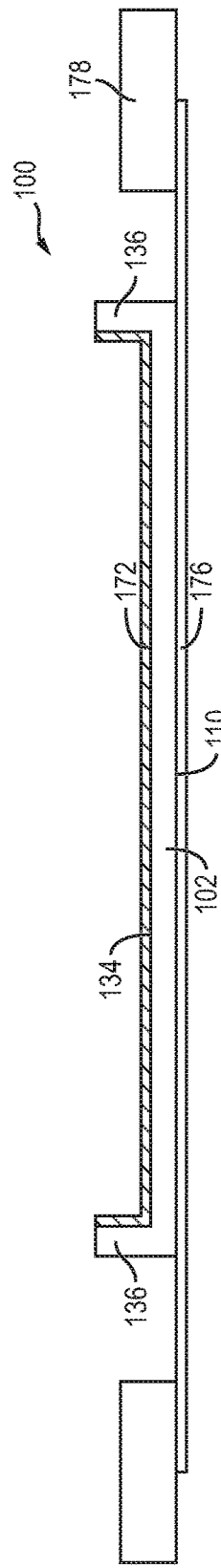
Figure 2H:
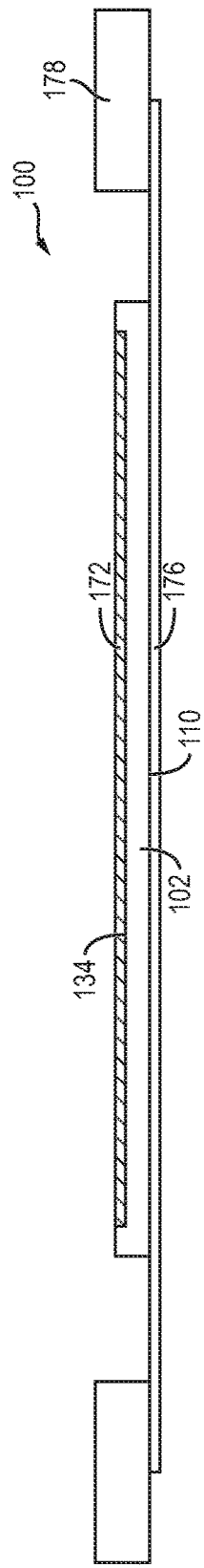

In FIG. 2g, the thinned semiconductor wafer 100 is mounted with active surface 110 oriented to tape portion 176 of film frame or carrier 178. In FIG. 2h, edge support ring 136 is removed to be planar with or just above (10-13 µm) conductive layer 172 or surface 134.

Figure 3A:
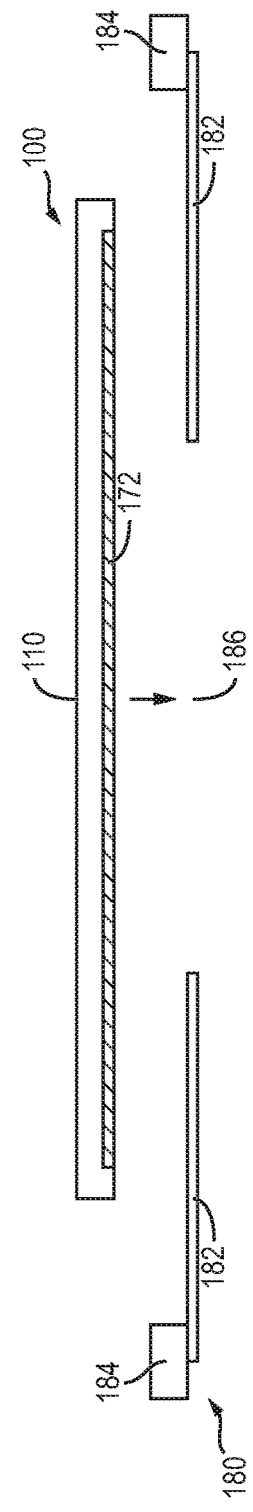
FIGS. 3a-3s illustrate a process of probe testing from a backside of the thinned semiconductor wafer through one or more openings in a tape portion of a film frame.
Figure 3B:
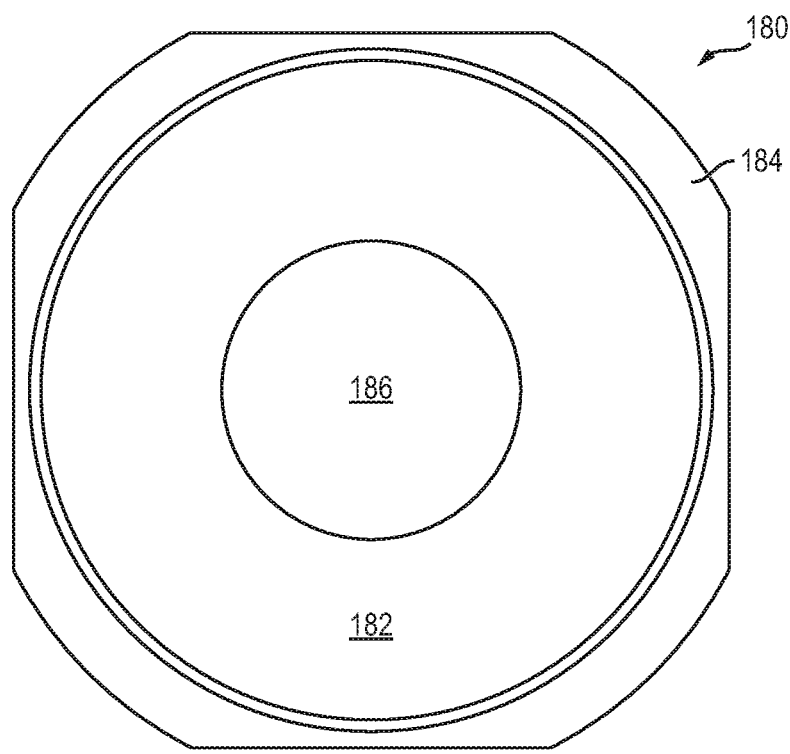
Figure 3C:
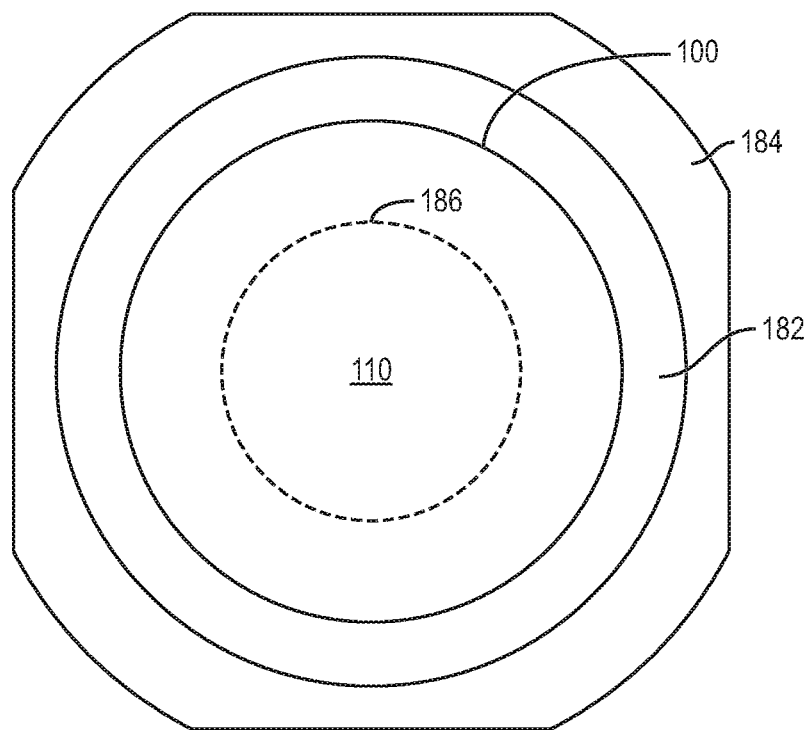
Figure 3D:
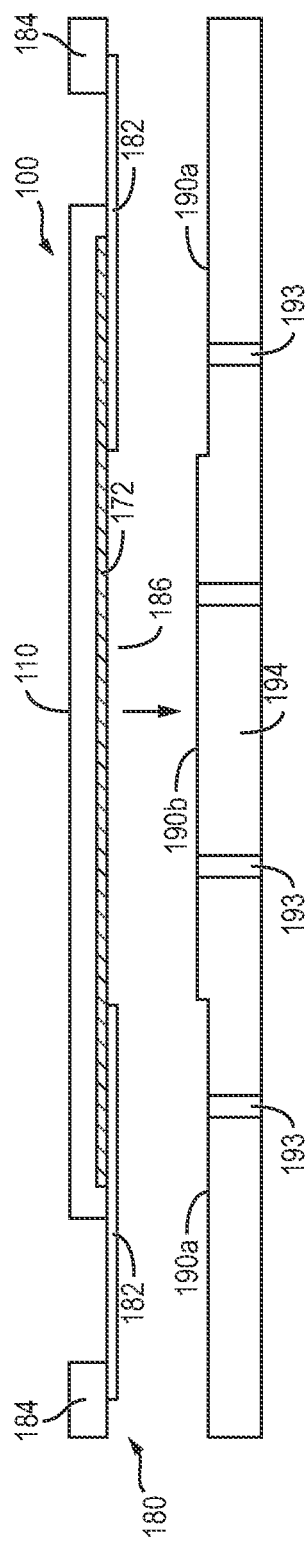
Figure 3E:
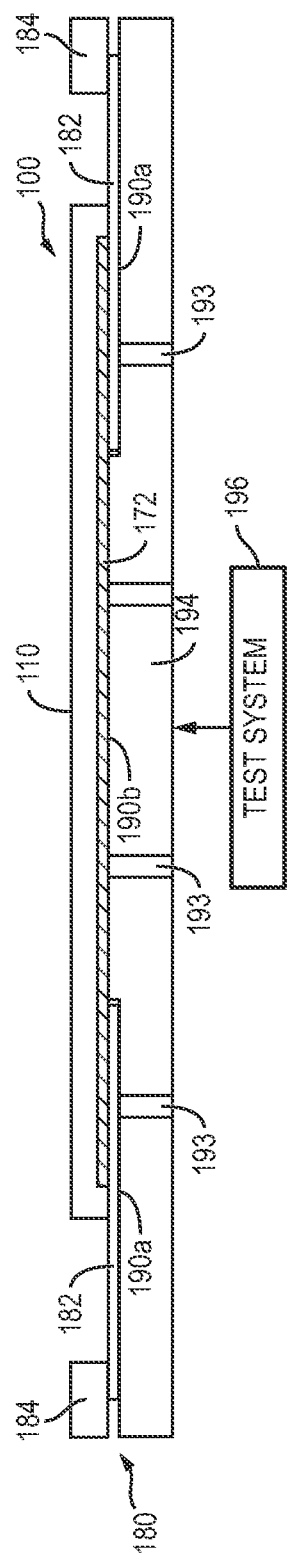
Figure 3H:
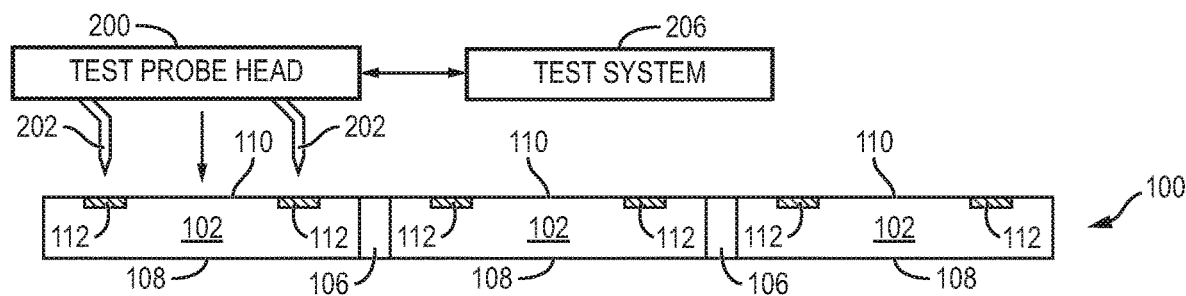
Figure 3I:
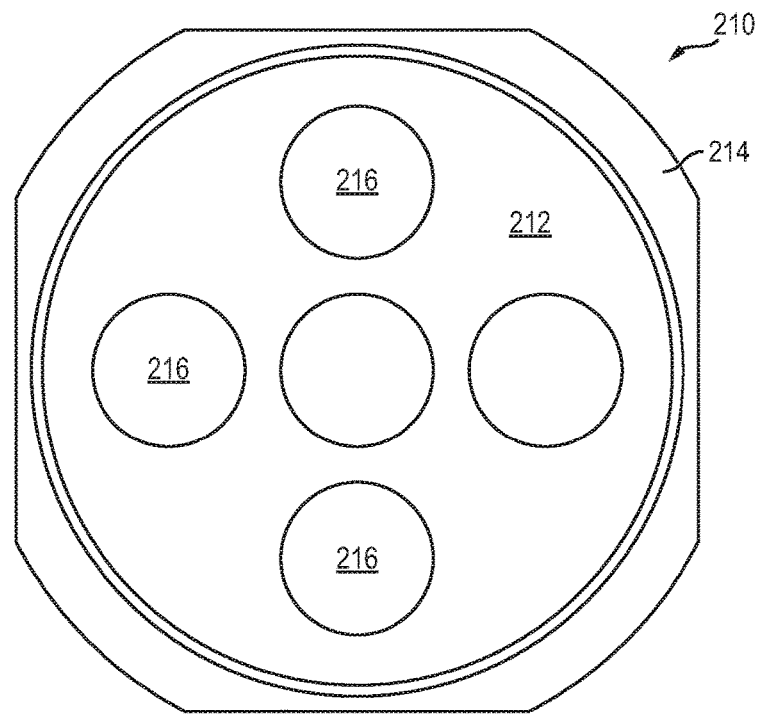
Figure 3J:
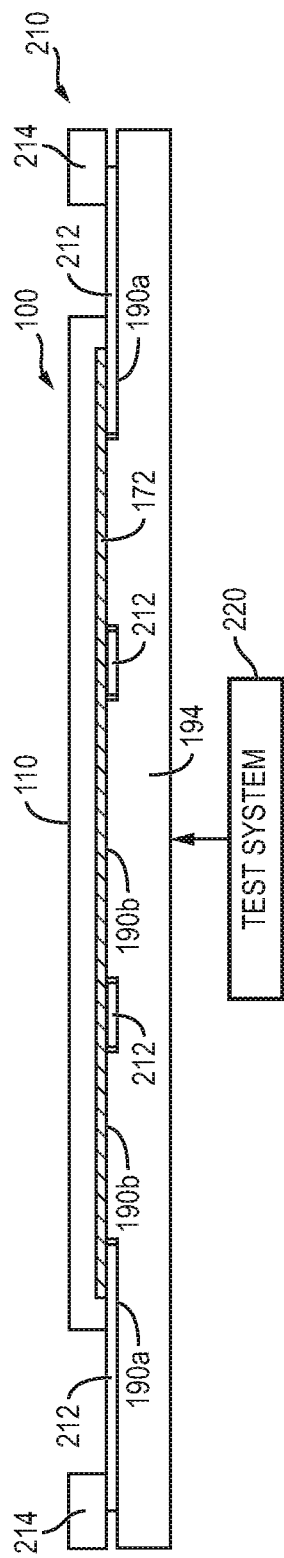
Figure 3K:
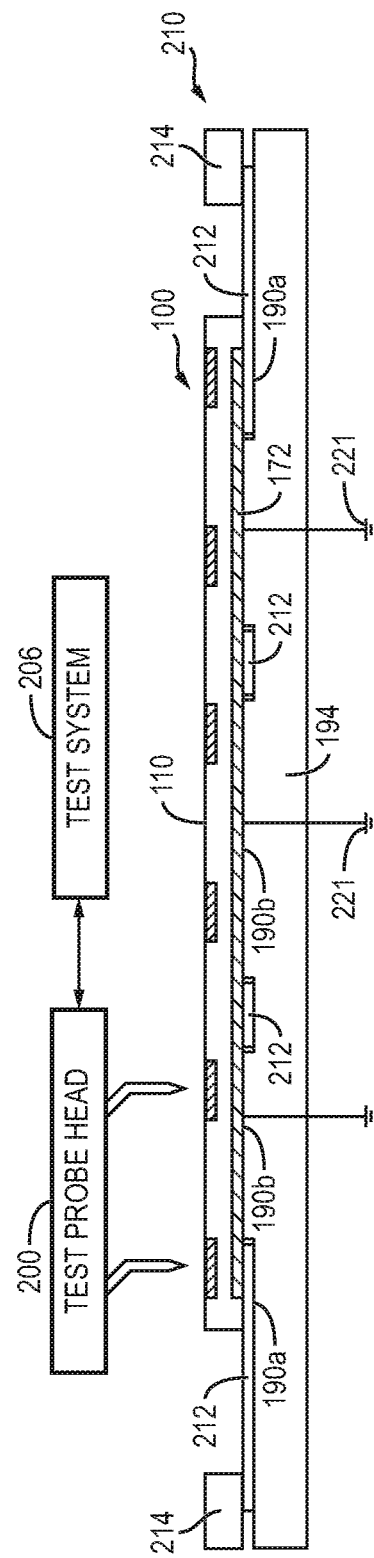
Figure 3L:
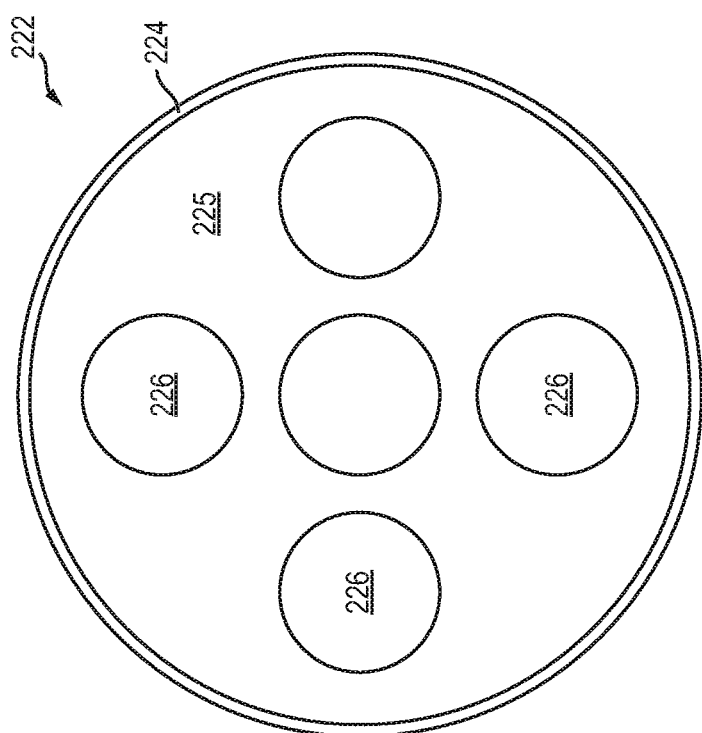
Figure 3M:
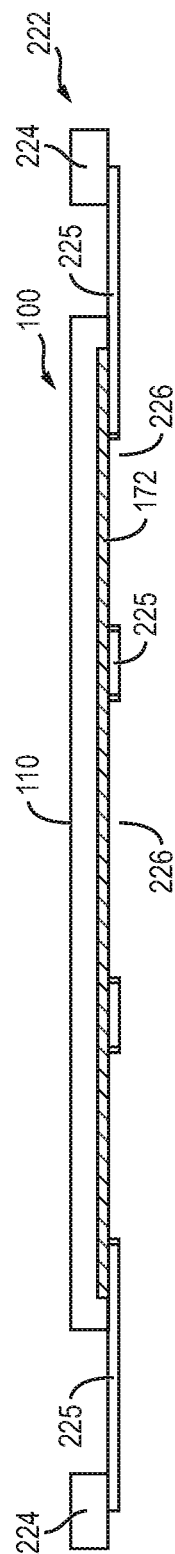
Figure 3Q:
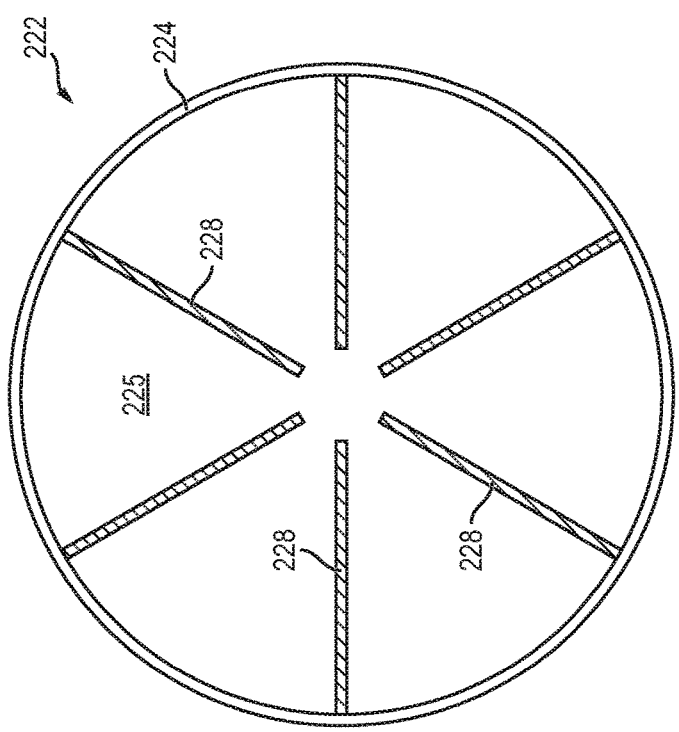
Figure 3R:
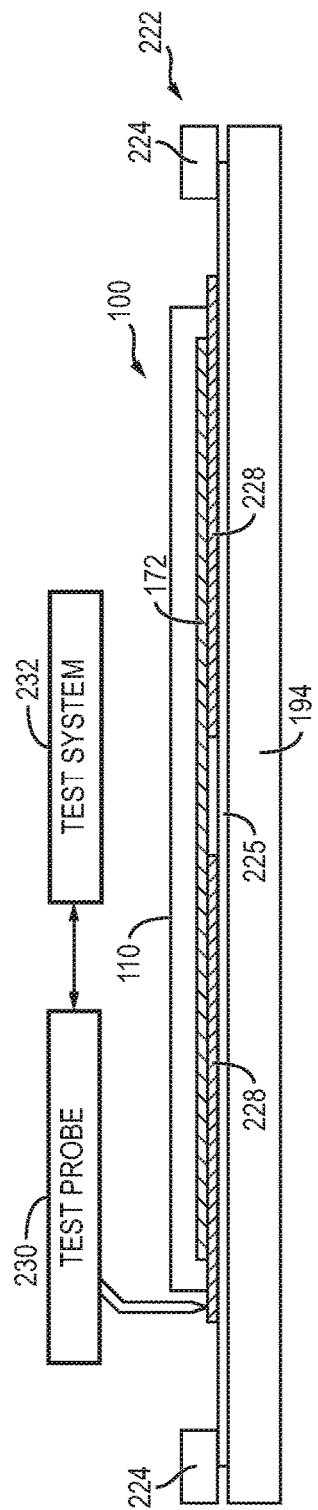
Figure 3S:
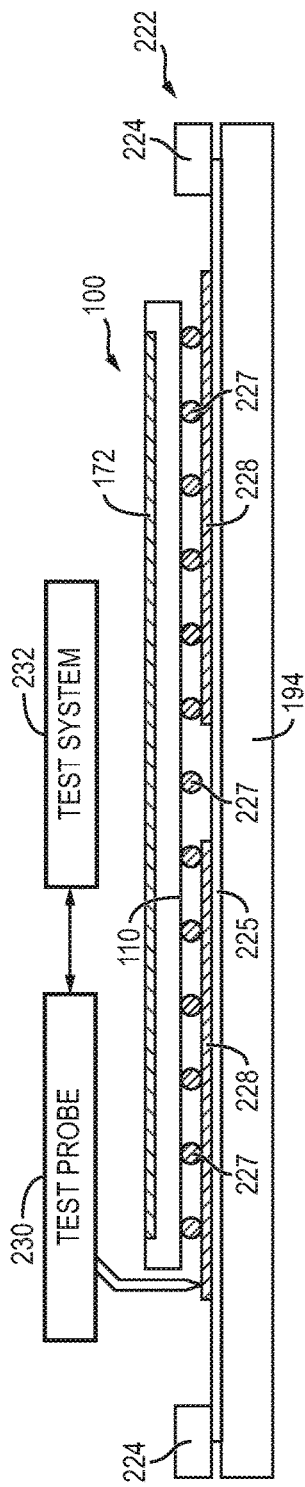

FIGS. 3a-3s illustrate various configurations for probe testing the semiconductor wafer. In FIG. 3a, the thinned semiconductor wafer 100 is removed from film frame 178 and positioned above film frame or carrier 180 with conductive layer 172 on surface 134 oriented toward the film frame. Semiconductor die 104 on the thinned semiconductor wafer 100 have a full feature set, i.e., all functional components and layers have been formed, ready for probe testing of the final semiconductor die. Film frame 180 includes tape portion 182 and edge support 184. In particular, tape portion 182 includes an opening 186 extending through a center region of the tape portion. The thinned semiconductor wafer 100 is positioned over film frame 180 with conductive layer 172 aligned and centered with opening 186. FIG. 3b shows a top view of film frame 180 with tape portion 182 and opening 186 extending through a center region of the tape portion. Semiconductor wafer 100 is mounted to tape portion 182 of film frame 180 with a portion of conductive layer 172 disposed over opening 186. FIG. 3c shows a top view of semiconductor wafer 100 mounted to tape portion 182 of film frame 180. Conductive layer 172 is accessible through opening 186 in tape portion 182.

In FIG. 3d, semiconductor wafer 100 and film frame 180 are positioned over surface 190 of wafer probing chuck 194. Surface 190 has lower portion 190a and raised portion 190b. The raised portion 190b is aligned with opening 186. FIG. 3e shows film frame 180 with semiconductor wafer 100 mounted to surface 190 of wafer probing chuck 194 with tape portion 182 contacting lower portion 190a of surface 190, and raised portion 190b extending through opening 186 to contact conductive layer 172. In one implementation, wafer probing chuck 194 draws a vacuum through ports 193 to hold tape portion 182 and semiconductor wafer 100 securely in place with surface 134 and a first portion of conductive layer 172 held flat against and in contact with tape portion 182, tape portion 182 held flat against and in contact with lower portion 190a of surface 190, and a second portion of conductive layer 172 held flat against and in contact with raised portion 190b of surface 190. In FIG. 3f, a porous ceramic chuck 194, with the same surface 190 including lower portion 190a and raised portion 190b, evenly distributes the vacuum forces to hold semiconductor wafer 100 and film frame 180 flat against lower portion 190a and raised portion 190b of surface 190. Semiconductor wafer 100 and film frame 180 being held flat against lower portion 190a and raised portion 190b of surface 190 by vacuum ports 193 or porous chuck 194 keeps the wafer stable and planar during probe testing. Alternatively, tape portion 182 and semiconductor wafer 100 are held securely in place by a press-fit with force F, as shown in FIG. 3g, with surface 134 and a first portion of conductive layer 172 held flat against and in contact with tape portion 182, tape portion 182 held flat against and in contact with lower portion 190a of surface 190 of chuck 195, and a second portion of conductive layer 172 held flat against and in contact with raised portion 190b of surface 190. Chuck 195 has the same surface 190 with lower portion 190a and raised portion 190b.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

The active and passive components within semiconductor die 104 undergo testing at the wafer-level for electrical performance and circuit function. Each semiconductor die 104 is tested for functionality and electrical parameters. The raised portion 190b of surface 190 of wafer probing chuck 194 makes electrical contact with conductive layer 172 through opening 186. A computer controlled test system 196 sends electrical test signals through wafer probing chuck 194 and raised portion 190b of surface 190, which extends through opening 186, to provide electrical stimuli to conductive layer 172. Alternatively, computer controlled test system 196 sends electrical test signals through conductive channels within wafer probing chuck 194 and raised portion 190b of surface 190 to provide electrical stimuli to conductive layer 172. Conductive layer 172 is coupled to circuits on active surface 110 through TSV or vertically formed semiconductor devices. Semiconductor die 104 responds to the electrical stimuli, which is measured by computer test system 196 and compared to an expected response to test functionality of the semiconductor die.

The testing of semiconductor wafer 100 from the backside directly to conductive layer 172 is achieved through raised portion 190b of surface 190 of wafer probing chuck 194 extending through opening 186 in tape portion 182 of film frame 180. Many testing procedures can be accomplished with wafer probe contact of raised portion 190b to conductive layer 172. For example, the electrical tests may include circuit functionality, lead integrity, resistivity, continuity, reliability, junction depth, ESD, RF performance, drive current, threshold current, leakage current, and operational parameters specific to the component type. The testing is conducted with the thinned semiconductor wafer 100 after wafer grinding. The thinned semiconductor wafer 100 remains flat and stable by nature of lower portion 190a and raised portion 190b of surface 190 of wafer probing chuck 194 held against conductive layer 172. The inspection and electrical testing of semiconductor wafer 100, after wafer thinning, enables semiconductor die 104, with a complete feature set that passes, to be designated as known good die for use in a semiconductor package.

Wafer level testing also encompasses advanced testing procedures, including curve tracing of semiconductor wafer 100 or other characterization of the device, to evaluate detailed electrical and thermal performance of the thin wafer or stacked wafer.

Semiconductor wafer 100 can also be tested from active surface 110, as shown in FIG. 3h. Each semiconductor die 104 is tested for functionality and electrical parameters using a test probe head 200 including a plurality of probes or test leads 202, or other testing device. Probes 202 are used to make electrical contact with nodes or conductive layer 112 on each semiconductor die 104 and provide electrical stimuli to interconnect pads 112. Semiconductor die 104 responds to the electrical stimuli, which is measured by computer test system 206 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

The tape portion may have multiple openings to provide access to different areas of conductive layer 172. As noted above, conductive layer 172 is patterned into electrically common or electrically isolated portions according to the function of semiconductor die 104. FIG. 3i shows a top view of film frame 210 including tape portion 212, edge support 214, and multiple openings 216. Tape portion 212 has as many openings 216 as necessary to perform testing of requisite areas of conductive layer 172. Openings 216 can be cut or punched through tape portion 212 prior to mounting the tape portion to edge support 214, or after mounting the tape portion to the edge support. Cutting openings 216 prior to mounting tape portion 212 to edge support 214 allows for standard cut-out patterns to match specific wafers 100, e.g., a perforated tape. Cutting openings 216 after mounting tape portion 212 to edge support 214 allows for a cut-out pattern customized for a specific wafer 100. Openings 216 can be cut using a laser or blade, or simply remove pre-cut portions of the tape.

Semiconductor wafer 100 is then mounted to tape portion 212, as shown in FIG. 3j. In this case, wafer probing chuck 194 would have multiple raised portions 190b aligned with openings 216. Film frame 210 with semiconductor wafer 100 is mounted to surface 190 of wafer probing chuck 194 with tape portion 212 contacting lower portion 190a of surface 190 and multiple raised portion 190b extending through multiple openings 216 to contact different areas of conductive layer 172. Tape portion 212 and semiconductor wafer 100 are held securely in place by a press-fit or vacuum assist with surface 134 and first portions of conductive layer 172 held flat against and in contact with tape portion 212, tape portion 212 held flat against and in contact with lower portion 190a of surface 190, and second portions of conductive layer 172 held flat against and in contact with raised portion 190b of surface 190. Semiconductor wafer 100 and film frame 210 being held flat against lower portions 190a and raised portions 190b of surface 190 by press-fit or vacuum assist keeps the wafer stable and planar during probe testing.

The multiple raised portions 190b of surface 190 of wafer probing chuck 194 make electrical contact with corresponding areas of conductive layer 172 through openings 216. A computer controlled test system 220 sends electrical test signals through wafer probing chuck 194 and raised portions 190b of surface 190, which extends through openings 216, to provide electrical stimuli to different areas of conductive layer 172. Semiconductor die 104 responds to the electrical stimuli, which is measured by computer test system 220 and compared to an expected response to test functionality of the semiconductor die.

In one implementation, as shown in FIG. 3k, semiconductor wafer 100 is tested from active surface 110, see FIG. 3h, with electrical connection from ground reference node 221 to conductive layer 172 being made through openings 216 in tape portion 212. Multiple portions of conductive layer 172 can be electrically connected to external ground reference node 221 through openings 216. A sample portion of semiconductor wafer 100 can be tested from active surface 110.

Alternatively, wafer ring holder 222 with grip ring 224, as shown in FIG. 3l, can be used for mounting semiconductor wafer 100. Wafer ring holder 222 is typically plastic or other light-weight material for low-cost and ease of handling. Grip ring 224 secures and holds tape portion 225 for mounting semiconductor wafer 100. Openings 226 can be formed in tape portion 225, as described above. Other tape holders can be used to secure tape portion 225 when mounting semiconductor wafer 100.

FIG. 3m shows semiconductor wafer 100 mounted to tape portion 225 on wafer ring holder 222 with conductive layer 172 oriented toward the tape portion and active surface 110 oriented away from the tape portion. FIG. 3n shows semiconductor wafer 100 mounted to tape portion 225 on wafer ring holder 222 with active surface 110 oriented toward the tape portion and conductive layer 172 oriented away from the tape portion. With the use of TSV, the orientation of semiconductor wafer 100 is interchangeable. Semiconductor wafer 100 can have bumps 227 on active surface 110, as shown in FIG. 3o, or no bumps, as in FIG. 3k. Semiconductor wafer 100 can be tested with active surface 110 and bumps 227 oriented toward tape portion 225 or away from the tape portion. Semiconductor wafer 100 can be tested with active surface 110 and no bumps oriented toward tape portion 225 or away from the tape portion. A sample portion of semiconductor wafer 100 can be tested with active surface 110 of semiconductor wafer 100 oriented toward tape portion 225 or away from the tape portion.

In another implementation, semiconductor wafer 100 is mounted to tape portion 225 without openings 226 to avoid stretching, non-uniformity, or other distortion in the tape portion or openings, see FIG. 3p. Tape portion 225 without openings 226 can also be placed over semiconductor wafer 100. Multiple semiconductor wafers 100 can be mounted to tape sheet or roll while maintaining uniform tension across the tape sheet. Once semiconductor wafer 100 is mounted, openings 226 are cut through tape portion 225 using a laser, blade, or by simply removing pre-cut portions of the tape, similar to FIG. 3l. Tape portion 225 with semiconductor wafer 100 is affixed to grip ring 224 of wafer ring holder 222 either prior to or after cutting openings 226.

FIG. 3q shows conductive traces 228 formed on a surface of tape portion 225 as mounted to wafer ring holder 222 with precise placement of the conductive paths. Tape portion 225 can be laminated to wafer ring holder 222 for access orientation and alignment of conductive traces 228, which are then formed by lamination, printing, or shadow mask metal film deposition. In FIG. 3r, semiconductor wafer 100 is mounted to tape portion 225 and aligned with conductive traces 228 formed on tape portion 225 to make electrical contact and perform the necessary probe testing. In this case, test probes 230 contact conductive traces 228 from the topside, outside wafer ring holder 222. Test probe signals are routed from test probes 230 along conductive traces 228 to conductive layer 172 in order to test functionality and electrical parameters of semiconductor wafer 100. FIG. 3s shows semiconductor wafer 100 mounted with bumps 227 to tape portion 225 and aligned with conductive traces 228 formed on tape portion 225 to make electrical contact and perform the necessary probe testing. In this case, test probes 230 contact conductive traces 228 from the topside, outside wafer ring holder 222. Test probe signals are routed from test probes 230 along conductive traces 228 to bumps 227 in order to test functionality and electrical parameters of semiconductor wafer 100.

Figure 4A:
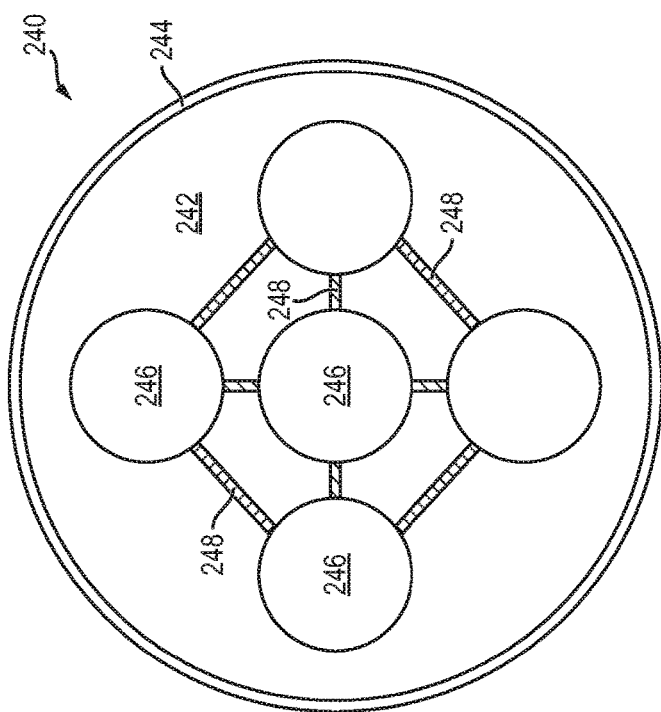
FIGS. 4a-4c illustrate a process of forming conductive channels on the tape.
Figure 4B:
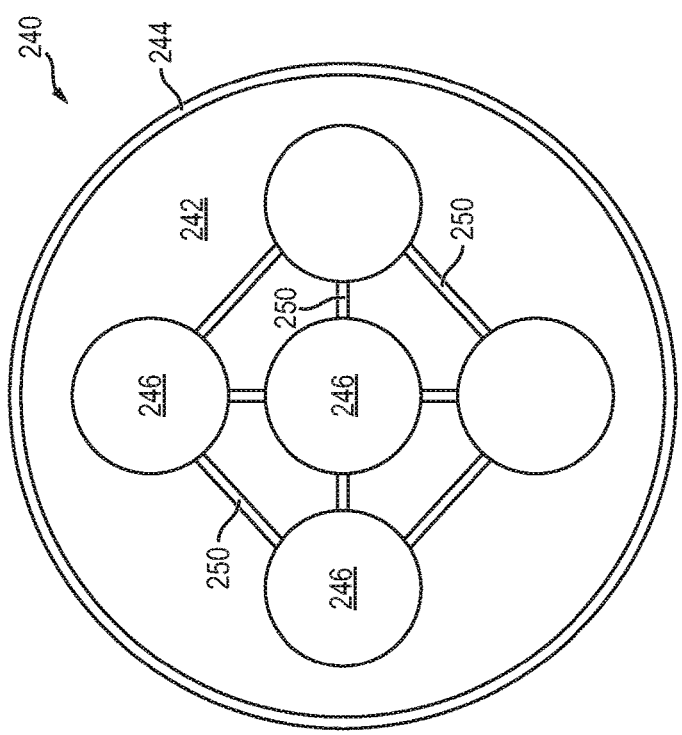

In another implementation, similar to FIGS. 3i-3j, the film frame or wafer ring holder may have multiple openings and conductive traces or channels formed in the tape portion of the wafer ring holder to provide access to different areas of the conductive layer. FIG. 4a shows a top view of wafer ring holder 240 including tape portion 242, grip ring 244, and multiple openings 246. Conductive traces 248 formed on the surface of tape portion 242 or formed through the tape portion. Alternatively, tape portion 242 may be made with channels of conductive carbon 240, as shown in FIG. 4b. Tape portion 242 has as many multiple openings 246 and conductive traces 248 or channels 250 as necessary to perform probe testing of requisite areas of conductive layer 172. In another implementation, any portion or the entire tape portion 242 may be conductive to perform testing of requisite areas of conductive layer 172. Tape portion 242 and semiconductor wafer 100 are held securely in place by a press-fit or vacuum assist with surface 134 and first portions of conductive layer 172 held flat against and in contact with tape portion 242, tape portion 242 held flat against and in contact with lower portion 190a of surface 190, and second portions of conductive layer 172 held flat against and in contact with raised portion 190b of surface 190. Semiconductor wafer 100 and wafer ring holder 240 being held flat against lower portions 190a and raised portions 190b of surface 190 by press-fit or vacuum assist keeps the wafer stable and planar during probe testing.

Figure 4C:
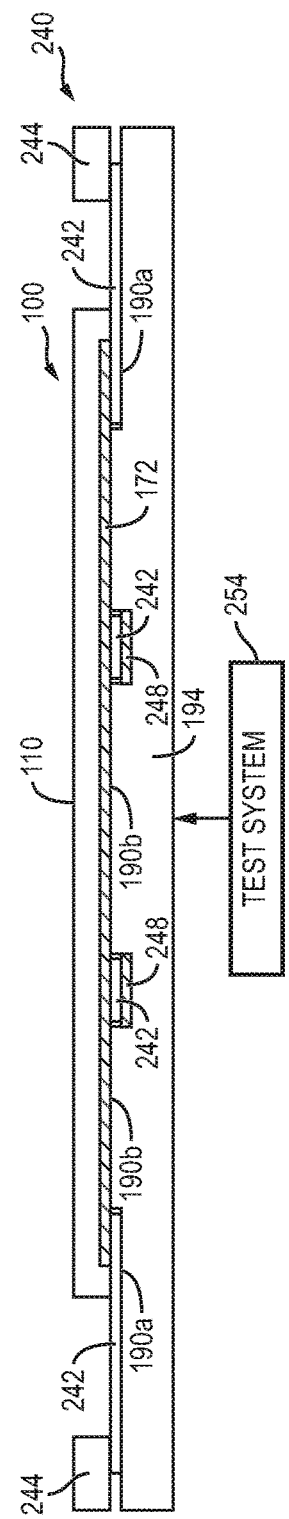

In FIG. 4c, the multiple raised portions 190b of surface 190 of wafer probing chuck 194 make electrical contact with corresponding areas of conductive layer 172 through openings 246 and conductive traces 248 or channels 250. Computer controlled test system 254 sends electrical test signals through wafer probing chuck 194 and raised portions 190b of surface 190, which extends through openings 246, to provide electrical stimuli through conductive traces 248 or channels 250 to different areas of conductive layer 172. Semiconductor die 104 responds to the electrical stimuli, which is measured by computer test system 254 and compared to an expected response to test functionality of the semiconductor die.

The wafer ring holder and semiconductor wafer 100 are moved from wafer probing chuck 194 and the thinned semiconductor wafer 100 is singulated through saw streets 106 using a saw blade or laser cutting tool or plasma etch into individual semiconductor die 104. The individual semiconductor die 104 from the thinned semiconductor wafer 100 have been probe tested in the final configuration of the semiconductor die.

Figure 5:
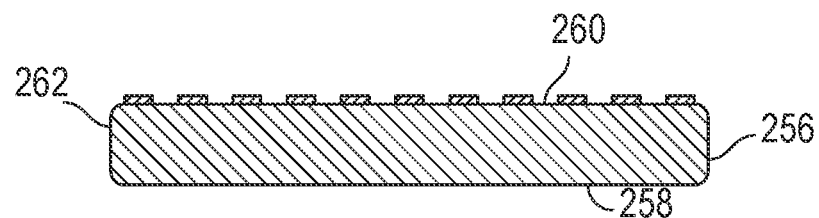
FIG. 5 is a side view of an implementation of a semiconductor substrate with an edge ring.

Referring to FIG. 5, a side view of an implementation of a semiconductor substrate is illustrated. As illustrated, the substrate 256 includes a first side 258 and a second side 260. In various implementations, by non-limiting example, the second side 260 includes a plurality of semiconductor die formed therein/thereon. As illustrated, the substrate 265 also includes edge 262. In this implementation, the edge 262 includes an edge ring. In various implementations, by non-limiting example, the substrate 256 may have a thickness of less than 39 microns or less than 10 microns. In other implementations, however, the wafer may be thicker than about 39 microns.

Figure 6:
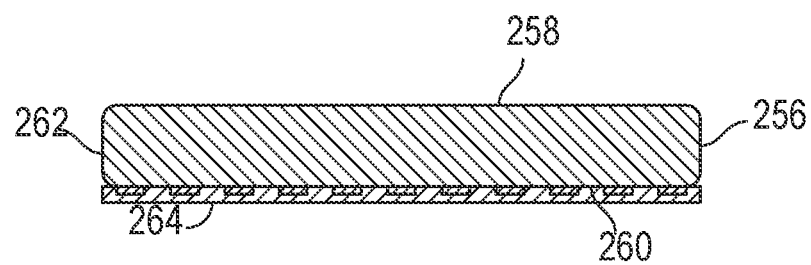
FIG. 6 is a side view of an implementation of a semiconductor substrate with backgrinding tape applied.

Referring to FIG. 6, a side view of an implementation of a semiconductor substrate with backgrinding tape applied is illustrated. As illustrated, a substrate 256 includes a first side 258 and a second side 260. As illustrated, backgrinding tape 264 is applied to the second side 260. In various implementations, by non-limiting example, the second side 260 may include a plurality of semiconductor die. As illustrated, the substrate 256 also includes an edge 262 which includes an edge ring. While in the implementation illustrated in FIG. 6 the use of backgrinding tape is illustrated, in other substrate and method implementations disclosed herein, no backgrinding tape may be used during the backgrinding process. In addition, various polishing processes may be used to polish and/or thin the substrate in various implementations. In particular, in substrate and method implementations where the thickness of the wafer is less than about 25 microns, the use of backgrinding tape may be omitted.

Figure 7:
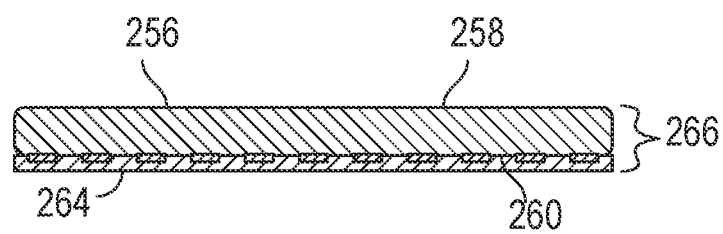
FIG. 7 is a side view of an implementation of semiconductor substrate after it has been background to a first thickness.

Referring to FIG. 7, a side view of the implementation of the semiconductor substrate of FIG. 6 after it has been background to a first thickness is illustrated. As illustrated, a substrate 256 includes a first side 258 and a second side 260. As illustrated, backgrinding tape 264 is applied to the second side 260. As illustrated, the first side 258 of the substrate 256 is background. In various implementations, by non-limiting example, the substrate 256 may be background to a first thickness 266 of 355 microns.

Figure 8:
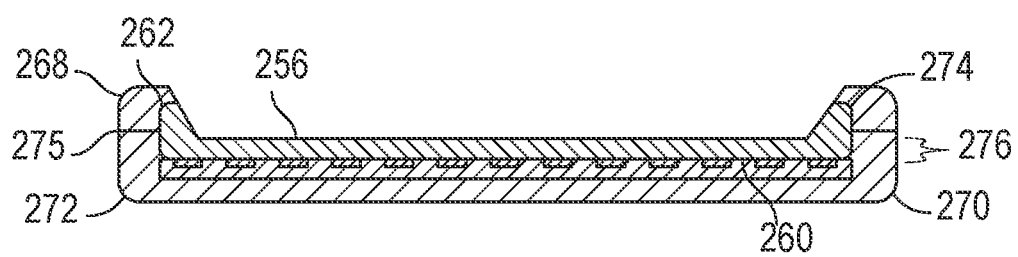
FIG. 8 is a side view of an implementation of a substrate partially enclosed by an implementation of a substrate carrier after it has been background to a second thickness.

Referring to FIG. 8, a side view of the substrate 256 implementation partially enclosed by a substrate carrier implementation 270 after it has been background to a second thickness is illustrated. As illustrated, a top ring 268 of a substrate carrier 270 encloses the edge 262 of the first side 258 of the substrate 256 and works to hold the edge 262 (including the edge ring) within the dimensions of the top ring 268. As illustrated, a bottom support 272 of a substrate carrier 270 also encloses the second side 260 and at least a portion of the edge 262 of the substrate 256. In various implementations, by non-limiting example, the substrate carrier 270 is not bonded to the substrate 256 but is held against the substrate using mechanical force only. In various implementations, the substrate carrier 270 is reusable through one or more semiconductor processing operations and/or for two or more semiconductor substrates. In various implementations, by non-limiting example, the edge 262 of the substrate 256 includes an edge ring 274 of the substrate 256. As illustrated, the first side 258 of the substrate 256 is background. In various implementations, by non-limiting example, the substrate 256 may be background to a second thickness 276 of 50 microns or less. As illustrated, the top ring 268 of the substrate carrier 270 is coupled to the bottom support 272 of the substrate carrier 272. As illustrated, the top ring 268 may be coupled to the bottom support 272 by a locking mechanism 275. In various implementation, by non-limiting example, the locking mechanism 275 may be a hinge, friction fit, clamp, snap, or any other form of locking or coupling mechanism capable of holding the top ring 268 to/over the bottom support 272.

Figure 9:
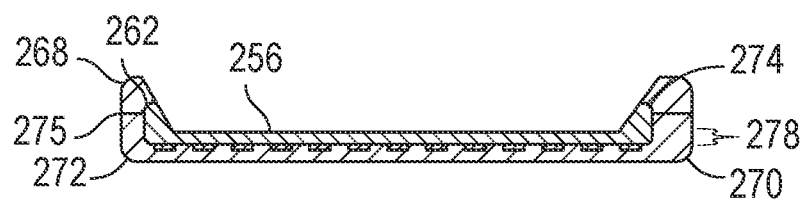
FIG. 9 is a side view of an implementation of a substrate partially enclosed by an implementation of a substrate carrier after it has been etched to a third thickness.

Referring to FIG. 9, a side view of the substrate implementation of FIG. 8 partially enclosed by a substrate carrier after it has been etched to a third thickness is illustrated. In various implementations, by non-limiting example, the substrate 256 may be etched to a third thickness 278 of 25 microns or less. In various implementations, this etching process may be a stress relief etch and/or an etch designed to reduce/eliminate backgrinding damage on the substrate. As illustrated, the top ring 268 of the substrate carrier 270 is coupled to the bottom support 272 of the substrate carrier 270 over the edge 262 and edge ring 274 of the substrate 256. As illustrated, the top ring 268 may be coupled to the bottom support 272 by a locking mechanism 275 which may be any disclosed in this document.

Figure 10:
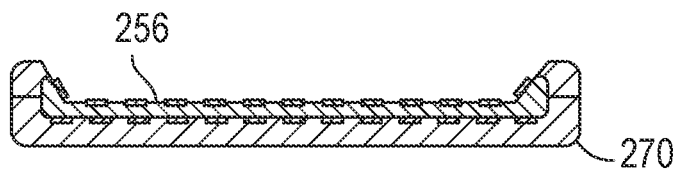
FIG. 10 is a side view of an implementation of a substrate partially enclosed by a substrate carrier implementation with a locking mechanism.

Referring to FIG. 10, a side view of a substrate partially enclosed by a substrate carrier with a locking mechanism is illustrated after application of a photolithographic pattern. The photolithographic pattern may be used in various subsequent semiconductor processing operations, such as, by non-limiting example, ion implantation, etching, deposition, die singulation, or any other operation where patterning is needed. The implementation in FIG. 10 illustrates how, in various semiconductor process implementations, the substrate carrier 270 is designed to support the substrate 256 through one or more subsequent semiconductor process operations after the carrier 270 has been coupled mechanically with the substrate.

Figure 11:
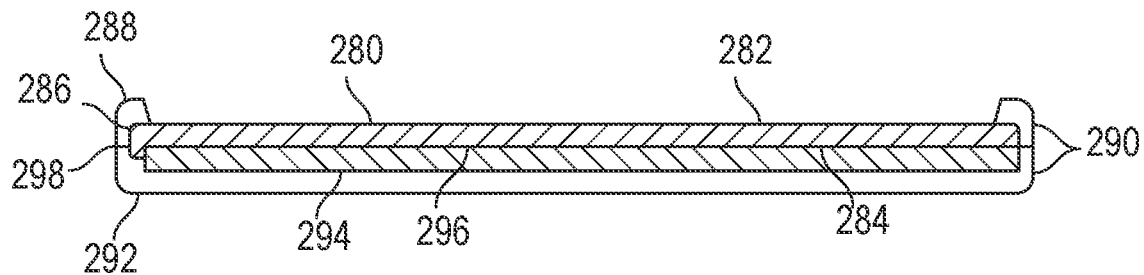
FIG. 11 is a side view of a substrate implementation without an edge ring partially enclosed by a substrate carrier implementation.

Referring to FIG. 11, a side view of a substrate partially enclosed by a substrate carrier implementation is illustrated. As illustrated, a substrate 280 includes a first side 282 and a second side 284. In various implementations, by non-limiting example, the second side 284 includes a plurality of semiconductor die formed therein/thereon. As illustrated, the substrate 280 also includes an edge 286. As illustrated, a top ring 288 of a substrate carrier 290 encloses the edge 286 of the first side 282 of the substrate 280. As illustrated, a bottom support 292 of a substrate carrier 290 encloses the second side 284 and the edge 286 of the substrate 280. In various implementations, by non-limiting example, the substrate carrier 290 is only mechanically coupled with the substrate 280. Like the other substrate carriers disclosed in this document, the carrier may be reusable. As illustrated, the bottom support 292 includes a cavity 294 therein. In various implementations, by non-limiting example, the cavity 294 is sized to receive backgrinding tape 296 applied to the second side 284 of the substrate 280 into the cavity 294 so the substrate 280 can lay flat against the bottom support 292. As illustrated, the top ring 288 of the substrate carrier 290 is coupled to the bottom support 292 of the substrate carrier 290. As illustrated, the top ring 288 may be coupled to the bottom support 292 by a locking mechanism 298 which may be any disclosed in this document.

Figure 12:
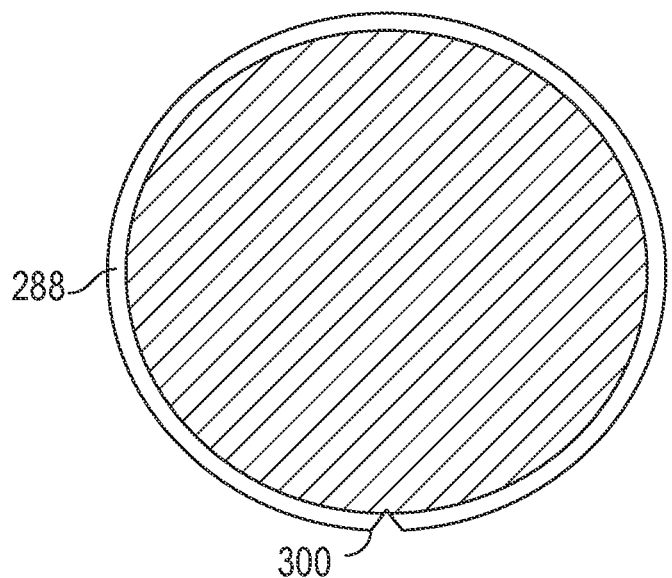
FIG. 12 is a top view of a substrate implementation partially enclosed by a substrate carrier implementation.

Referring to FIG. 12, a top view of the substrate of FIG. 7 partially enclosed by a substrate carrier is illustrated. As illustrated, the top ring 288 may include an alignment notch opening 300 in the ring to allow the substrate alignment notch to be made available for use by various semiconductor processing tools, such as, by non-limiting example, notch aligners, optical character readers, and other equipment that uses the notch during operation. For substrates with flats, the top ring 288 may also include corresponding flat access sections therein or may follow the shape of the flat so that processing equipment can be adjusted to still recognize the position of the flat(s) on the substrate. The bottom portion of the carrier may also be sized to correspond with the dimensions of the flat(s) of the substrate in various implementations.

Figure 13:
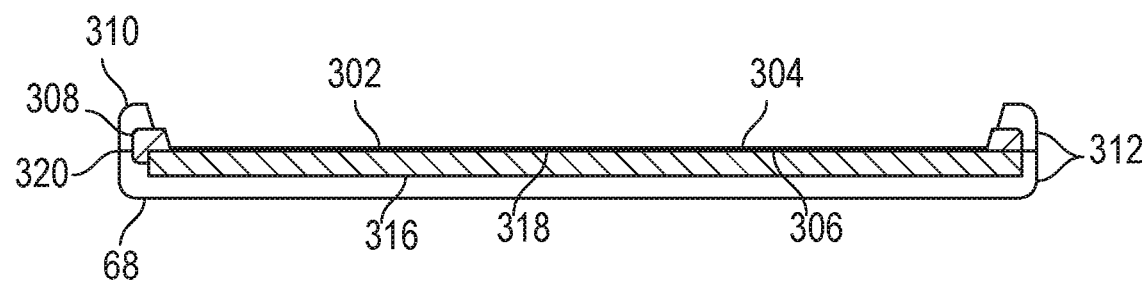
FIG. 13 is a side view of a substrate implementation with an edge ring partially enclosed by a substrate carrier implementation.

Referring to FIG. 13, a side view of a substrate including an edge ring partially enclosed by a substrate carrier implementation is illustrated. As illustrated, a substrate 302 includes a first side 304 and a second side 306. In various implementations, by non-limiting example, the second side 306 includes a plurality of semiconductor die. As illustrated, the substrate 302 also includes an edge 308 with an edge ring. As illustrated, a top ring 310 of a substrate carrier 312 encloses the edge 308 of the first side 304 of the substrate 302. As illustrated, a bottom support 314 of a substrate carrier 312 encloses the second side 306 and the edge 308 of the substrate 302. As illustrated, the bottom support 314 includes a cavity 316 therein. In various implementations, by non-limiting example, the cavity 316, like the cavity in FIG. 11, is sized to receive the thickness of a backgrinding tape 318 applied to the second side 306 of the substrate 302. As illustrated, the top ring 310 of the substrate carrier 312 is coupled to the bottom support 314 of the substrate carrier 312. As illustrated, the top ring 310 may be coupled to the bottom support 314 by a locking mechanism 320 which may be any disclosed in this document.

Figure 14:
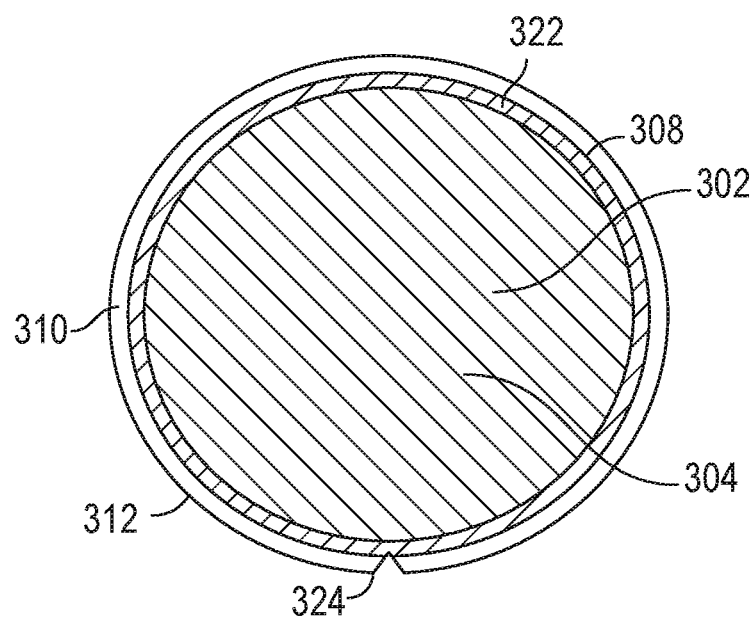
FIG. 14 is a top view of a substrate implementation with an edge ring partially enclosed by a substrate carrier implementation.

Referring to FIG. 14, a top view of the substrate of FIG. 13 partially enclosed by a substrate carrier is illustrated. As illustrated, a substrate 302 includes a first side 304. As illustrated, the substrate 302 also includes an edge 308 with edge ring 322. As illustrated, a top ring 310 of a substrate carrier 312 encloses the edge 308 of the first side 304 of the substrate 302 and goes over at least a portion of the edge ring 322 as well, extending inwardly toward the center of the substrate. As illustrated, the top ring 310 may include an alignment notch 324 similar to the implementation in FIG. 12. The top ring 310 and the bottom portion of the substrate carrier may also correspondingly include one or more flats corresponding with the flat(s) in the substrate for those substrates that include flats.

Referring to FIG. 6-10, the figures illustrate substrate 256 at various steps in a method of thinning a substrate to a desired thickness. As illustrated, in the method implementations, backgrinding tape 264 is first applied to a second side 260 of a substrate 256. Next, the substrate 256 is background to a first thickness 266. Next, the substrate 256 is disposed in a bottom support 272 of a substrate carrier 270. Next, a top ring 268 of the substrate carrier 270 is coupled over an edge 262 of the substrate 256. The substrate 256 is then background to a second thickness 276. The substrate 256 is then etched to a third thickness 278. In various implementations, by non-limiting example, the substrate 256 may then be removed from the substrate carrier 270, and the substrate 256 may be singulated. In various method implementations, the process of etching to the third thickness may be omitted after the substrate carrier 270 is coupled to the substrate.

In various implementations described herein, a substrate may be, by non-limiting example, made from silicon, silicon dioxide, ruby, sapphire, single crystal silicon, polycrystalline silicon, glass, silicon-on-insulator, gallium arsenide, metal, metal alloys, or any other semiconductor substrate type. In various implementations, by non-limiting example, a substrate carrier may be made from a polymer, plastic, metal, or metal alloy or any combination thereof that is designed to be resistant to the various semiconductor processing steps through which the carrier will pass (etching, photoresist processing, ion implanting, etc.). Examples of polymer materials that may be used for substrate carrier implementations like those disclosed herein may include, by non-limiting example, perfluoroalkoxy alkanes, perfluoroethers, polytetrafluoroethylene, fluorinated ethylene propylene, or any combination thereof. Those of ordinary skill will readily be able to select suitable materials for the substrate carrier using the principles disclosed herein.

Figure 15:
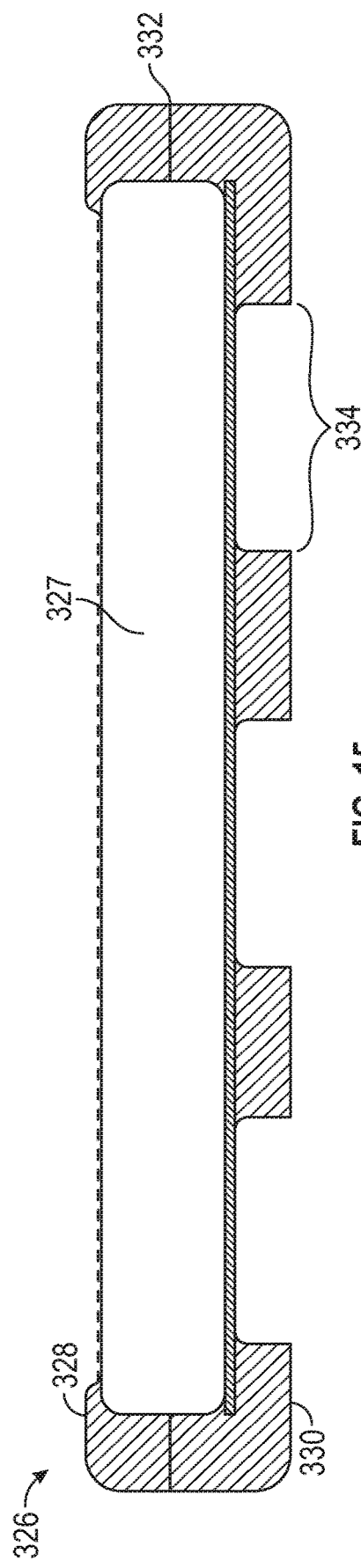
FIG. 15 is a side view of a substrate carrier having openings on bottom of the carrier.

Referring to FIG. 15, another implementation of a substrate carrier 326 is illustrated. The substrate carrier 326 may be formed of a hard material such as, by non-limited example, metal such as steel, metal coated with another low resistance metal such as gold, or plastic coated with metal or any of the other carrier materials disclosed herein. In various implementations, the carrier may be conductive or non-conductive. The substrate carrier 326 may be used with semiconductor wafers 327 that do not have an edge ring as illustrated. As previously described, other implementations of the carrier may be used with substrates including edge rings and may include corresponding structures for handling/coupling over/around the edge ring like those disclosed in this document. The substrate carrier may be reusable in various implementations. The substrate carrier may include a top ring 328 that may be coupled to a bottom support 330 through a locking mechanism 332. In various implementation, by non-limiting example, the locking mechanism 332 may be a hinge, friction fit, clamp, snap, or any other form of locking or coupling mechanism capable of holding the top ring 328 to/over the bottom support 330.

As illustrated, the substrate carrier 326 includes one or more openings 334 in the bottom support of the carrier 326. The one or more openings may be, by non-limiting example, circular, rectangular, square, elliptical, or any closed shape. The one or more openings may be used to test the various die in the substrate during or after wafer processing. The substrate may be tested by providing an electrical connection to the semiconductor substrate through the one or more openings 334 in the substrate carrier. In various implementations, this may be accomplished by having one or more probes/pins from an electrical tester extend through the one or more openings to contact the structure of the wafer. Any of the electrical tester implementations, probe types, pin types, and electrical testing structures disclosed in this document may be employed during electrical testing operations. In various implementations, the electrical testing may be structural testing or may be functional testing or a combination of both structural testing and functional testing. In various implementations, partial portions of semiconductor wafer or substrates may be included in the substrate carrier and used for testing in a substrate carrier. In various implementations, partial portions of substrates may be processed for testing using any of the carriers illustrated in this document. The ability to process partial portions of substrates/wafers may help to reduce waste of partial wafers therefore reducing costs in the manufacturing of semiconductor devices.

Figure 16:
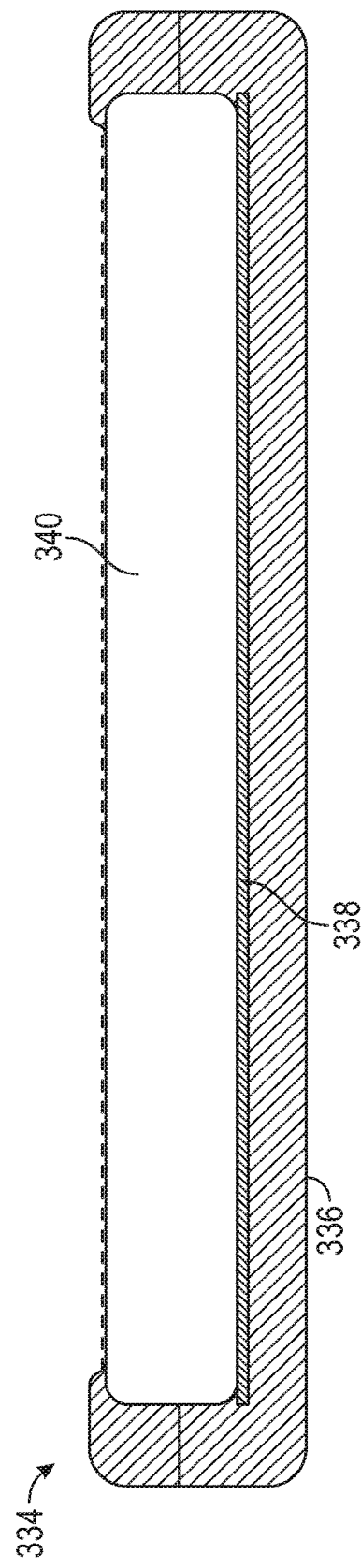
FIG. 16 is a side view of an implementation substrate carrier.

In various implementations where the substrate carrier 334 is formed of electrically conductive materials, one or more openings on a bottom support 336 of the substrate carrier 334 may not be necessary for testing the substrate. Referring to FIG. 16, an example of a substrate carrier 334 formed at least partially of an electrically conductive material is illustrated. A conductive portion 338 of the wafer 340 is disposed on the bottom support 336 of the carrier 334 contacting the electrically conductive portion of the carrier. The substrate may then be tested by contacting a testing probe/pin to the surface of the bottom support to provide an electrical connection to the substrate through the conductive material of the carrier. In some implementations, the entire bottom support 336 may be made of an electrically conductive material. In other implementations, however, only a portion of the bottom support 336 may be electrically conductive. In some implementations, none of the bottom support 336 may be electrically conductive and one or more traces/structures/vias formed of electrically conductive materials may be coupled with/through the structure of the bottom support 336 to allow the probe/pin to establish an electrical connection with the substrate.

In various implementations, a vacuum may be applied to a bottom of the substrate carrier to increase physical contact/holding force between the substrate and the bottom of the carrier. In some implementations, a reusable adhesive may be used on an inside of the bottom of the carrier as an aid to secure the substrate within the carrier during processing to prevent the substrate from moving in the carrier during testing and/or processing steps. The use of a reusable adhesive may be particularly helpful when one or more partial substrate portions are being processed using the carrier. Examples of reusable adhesives that may be employed in various carrier implementations may be manufactured under the tradename GEL-PAK by Delphon of Hayward, Calif.

In places where the description above refers to particular implementations of substrate carriers and implementing components, sub-components, methods and sub-methods, it should be readily apparent that a number of modifications may be made without departing from the spirit thereof and that these implementations, implementing components, sub-components, methods and sub-methods may be applied to other substrate carriers.

What is claimed is:

1. A substrate carrier comprising:
   a top ring configured to encircle an edge ring of a substrate; and
   a bottom support configured to enclose and directly contact a second side and an edge of the second side of the substrate.

2. The substrate carrier of claim 1, wherein the top ring is configured to enclose at least a portion of the edge ring of the substrate.

3. The substrate carrier of claim 1, wherein a first side of the substrate is background.

4. The substrate carrier of claim 1, wherein the second side of the substrate comprises a plurality of semiconductor die therein.

5. The substrate carrier of claim 1, wherein a thickness of the substrate is less than 39 microns.

6. The substrate carrier of claim 1, wherein a thickness of the substrate is less than 10 microns.

7. The substrate carrier of claim 1, wherein the top ring is configured to couple to the bottom support with a one of a clamp, friction fit, snap, or hinge.

8. The substrate carrier of claim 1, wherein the substrate carrier is not bonded to the substrate.

9. A substrate carrier comprising:
- a top ring configured to enclose at least a portion of an edge ring of a first side of a substrate;
- a bottom support configured to contact a second side and enclose an edge of the second side of the substrate, wherein the bottom support further comprises a cavity between the second side and the bottom support, the cavity configured to receive backgrinding tape applied to the second side of the substrate; and
- a locking mechanism configured to couple the top ring to the bottom support.

10. The substrate carrier of claim 9, wherein the top ring encircles the edge ring of the substrate.

11. The substrate carrier of claim 9, wherein the first side of the substrate is background.

12. The substrate carrier of claim 9, wherein the second side of the substrate comprises a plurality of semiconductor die therein.

13. The substrate carrier of claim 9, wherein a thickness of the substrate is less than 39 microns.

14. The substrate carrier of claim 9, wherein a thickness of the substrate is less than 10 microns.

15. The substrate carrier of claim 9, wherein the locking mechanism comprises one of a clamp, friction fit, snap, or hinge.

16. The substrate carrier of claim 9, wherein the substrate carrier is not bonded to the substrate.

17. An apparatus for testing a semiconductor substrate, comprising:
- a substrate carrier, the substrate carrier comprising:
  - a top ring configured to enclose an edge ring of a substrate;
  - a bottom support configured to enclose and contact a second side and the edge ring of the substrate, wherein the bottom support is configured to allow the substrate coupled with the substrate carrier to be electrically tested using a probe; and
  - a locking mechanism configured to couple the top ring to the bottom support.

18. The apparatus of claim 17, further comprising one or more openings in the bottom support configured to allow the probe to directly contact the substrate during electrical testing.

19. The apparatus of claim 17, wherein the substrate carrier is formed of one of a metal, a plastic coated in a metal, or a metal coated in a secondary metal.

20. The apparatus of claim 17, wherein the substrate carrier is one of formed of an electrically conductive material or comprises an electrically conductive material coupled thereto.

* * * * *